United States Patent
Lu (10) Patent No.: US 8,274,104 B2
(45) Date of Patent: Sep. 25, 2012

(54) REPAIR STRUCTURE AND ACTIVE DEVICE ARRAY SUBSTRATE

(75) Inventor: An-Hsu Lu, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 1082 days.

(21) Appl. No.: 11/567,217

(22) Filed: Dec. 6, 2006

(65) Prior Publication Data

US 2007/0290187 A1 Dec. 20, 2007

(30) Foreign Application Priority Data

Jun. 19, 2006 (TW) .............................. 95121866 A (51) Int. Cl.
*H01L 31/062* (2012.01)
(52) U.S. Cl. ......... 257/291; 257/223; 257/227; 257/443
(58) Field of Classification Search ................. 257/223, 257/227, 291, 292, 439, 443, 655, E27.1, 257/E27.125, 12, E29.117, E29.145, E29.147, 257/E29.151, E29.182, E29.202, E29.273–E29.299, 257/E29.314, E29.32, E23.016, 57, 59, 72, 257/83, 257, 290, 351, 368, 392
See application file for complete search history.

(56) References Cited

U.S. PATENT DOCUMENTS

| 2005/0116915 A1 | 6/2005 | Nakajima et al. |
| 2006/0071212 A1* | 4/2006 | Song et al. .................. 257/59 |

FOREIGN PATENT DOCUMENTS

| JP | 07175085 | 7/1995 |
| JP | 2007-241289 | 9/2007 |
| TW | I240813 | 10/2005 |

OTHER PUBLICATIONS

"Office Action of Taiwan counterpart application", issued on Apr. 26, 2010, p. 1-p. 5.
"Office Action of Japan counterpart application", issued on Apr. 20, 2010, p. 1-p. 2.

* cited by examiner

*Primary Examiner* — Jae Lee
(74) *Attorney, Agent, or Firm* — Jianq Chyun IP Office (57) ABSTRACT

A repair structure including a substrate, at least one first conducting line, a first insulating layer, at least one second conducting line and a repair connecting layer is provided. The at least one first conducting line is disposed on the substrate. The first insulating layer is disposed over the substrate to cover the first conducting line. The second conducting line is disposed over the first insulating layer. The second insulating layer covers the second conducting line and the first insulating layer. The repair connecting layer is disposed on the second insulating layer. In particular, the repair connecting layer is electrically connected to the first conducting line. The repair connecting layer overlaps the second conducting line but is electrically insulated from the second conducting line.

13 Claims, 7 Drawing Sheets

REPAIR STRUCTURE AND ACTIVE DEVICE ARRAY SUBSTRATE

CROSS-REFERENCE TO RELATED APPLICATION

This application claims the priority benefit of Taiwan application serial no. 95121866, filed on Jun. 19, 2006. All disclosure of the Taiwan application is incorporated herein by reference.

BACKGROUND OF THE INVENTION

1. Field of the Invention

The present invention relates to a repair structure and an active device array substrate, and more particularly, to a repair structure that can increase the repair yield and an active device array substrate that has a higher repair yield.

2. Description of Related Art

Although the technique of fabricating liquid crystal display is quite mature, defects are frequently produced in the process of fabricating the liquid crystal display panel. These defects in the liquid crystal display often cause discomfort to the user when an image is displayed. If all the defective liquid crystal display panels are directly scrapped, the manufacturing cost of the display panels will be significantly increased. In general, relying only on the improvement in the fabricating technique to achieve a zero defect rate is very difficult. Therefore, the technique for repairing defects in the liquid crystal display panel has become critical. In the conventional technique, defects in the liquid crystal display panel are repaired either by laser welding or laser cutting.

Typically, a liquid crystal display mainly includes a liquid crystal display panel and a back light module. The liquid crystal display panel mainly includes a thin film transistor array substrate and a color filter substrate. In the process of fabricating the thin film transistor array substrate, broken line defects are frequently produced. These broken line defects can be detected in an array test and can be repaired in a repair process by performing a laser chemical vapor deposition (laser CVD). However, not all of the broken line defects are suitable for a repair using the laser CVD process. For example, the broken line defects cannot be repaired in this way if the broken line defects are discovered after liquid crystal cells are assembled.

In addition, if the broken line defects are discovered after the thin film transistor array substrate and the color-filter substrate (not shown) are assembled together and liquid crystal (not shown) is injected, the laser CVD process cannot be used to perform a repair above the broken line because the thin film transistor array where the broken line occurs has already been entirely enclosed within the liquid crystal cell. To prevent the formation of any bright lines on the liquid crystal display panel (not shown), other repair methods, for example, using the repair lines of the thin film transistor array substrate, must be used to repair the liquid crystal display panel.

Figure 1A:
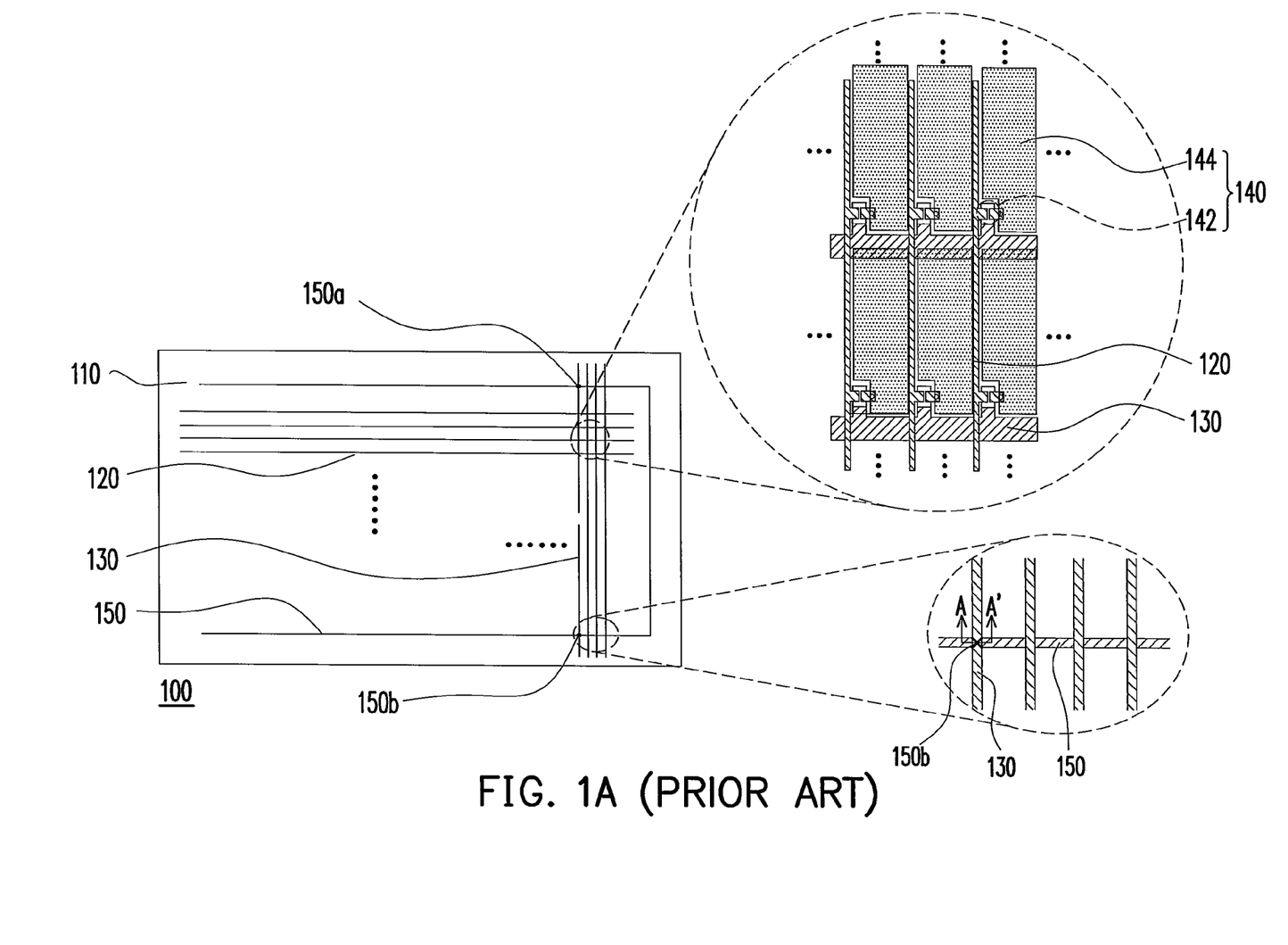
FIG. 1A is a top view of the structure of a conventional thin film transistor array substrate.
Figure 1B:
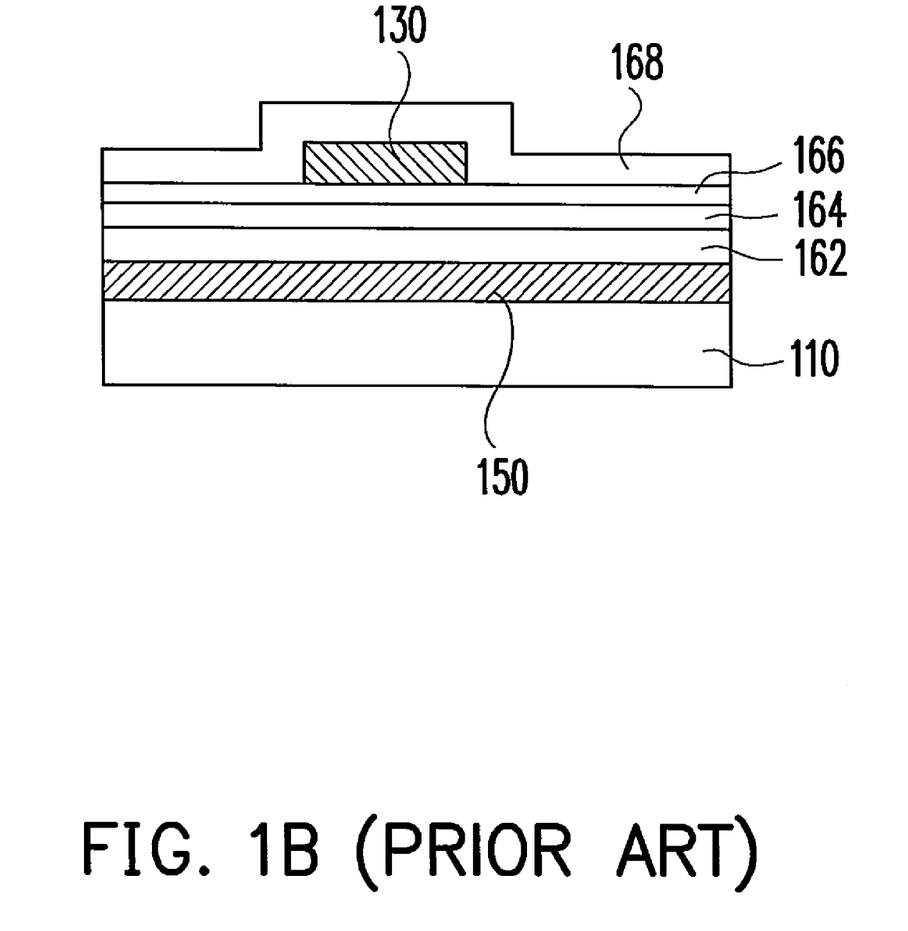
FIG. 1B is a schematic cross-sectional view along line A-A' of FIG. 1A.

FIG. 1A is a top view of the structure of a conventional thin film transistor array substrate. FIG. 1B is a schematic cross-sectional view along line A-A' of FIG. 1A. As shown in FIG. 1A, the thin film transistor array substrate 100 includes a substrate 110, a plurality of scan lines 120, a plurality of data lines 130, a plurality of pixel units 140 and a repair line 150. The scan lines 120, the data lines 130, the pixel units 140 and the repair line 150 are disposed over the substrate 110. Each of the pixel units 140 includes a thin film transistor 142 and a transparent conductive electrode, for example, an indium tin oxide (ITO) electrode 144. The thin film transistor 142 is electrically connected to one of the scan lines 120 and one of the data lines 130 correspondingly, and the indium tin oxide electrode 144 is electrically connected to one of the active devices 140 correspondingly.

After assembling the thin film transistor array substrate 100 and a color-filter substrate and injecting a liquid crystal into the space between them, a liquid crystal display panel is formed. However, if broken line defects are detected on the thin film transistor array substrate 100, a repair is performed through the repair line 150. For example, when a broken data line 130 is detected on the thin film transistor array substrate 100, a laser can be used to fuse the contacts 150a and 150b and connect the repair line 150 and the data line 130. Hence, through the repair line 150, most of the functions of the damaged data line 130 are reconstituted.

As shown in FIG. 1B, it should be noted that there is an insulating layer 162, an amorphous silicon layer 164 and a doped amorphous silicon layer 166 between the data line 130 and the repair line 150 and there is a protective layer 168 covering the data line 130. The thickness of the insulating layer 162, the amorphous silicon layer 164 and the doped amorphous silicon layer 166 is about 3500 Å (angstroms) to 8500 Å. When the laser is used to fuse and connect the data line 130 and the repair line 150, the laser would hardly burn through to the repair line 150 due to the greater total thickness of the film layers between the data line 130 and the repair line 150. As a result, the data line 130 and the repair line 150 may form a poor electrical contact or the data line 130 and the repair line 150 may not fuse together, thereby leading to a lowering of the repair yield.

SUMMARY OF THE INVENTION

Accordingly, one objective of the present invention is to provide a repair structure capable of increasing the repair yield.

Another objective of the present invention is to provide an active device array substrate that has a higher repair yield.

To achieve these and other advantages and in accordance with the purpose of the invention, as embodied and broadly described herein, the invention provides a repair structure. The repair structure includes a substrate, at least one first conducting line, a first insulating layer, at least one second conducting line, a second insulating layer and a repair connecting layer. The at least one first conducting line is disposed on the substrate. The first insulating layer is disposed over the substrate to cover the first conducting line. The second conducting line is disposed over the first insulating layer. The second insulating layer covers the second conducting line and the first insulating layer. The repair connecting layer is disposed on the second insulating layer. The repair connecting layer is electrically connected to the first conducting line. The repair connecting layer overlaps the second conducting line but is electrically insulated from the second conducting line.

According to the foregoing repair structure in one embodiment of the present invention, the second insulating layer has a thickness between 1500 Å and 5000 Å.

According to one embodiment of the present invention, the repair structure further includes at least one contact opening. The contact opening passes through the first insulating layer and the second insulating layer, and a portion of the repair connecting layer is electrically connected with the first conducting line through the contact opening.

According to one embodiment of the present invention, the repair structure further includes a semiconductor layer disposed between the first insulating layer and the second conducting line.

According to the foregoing repair structure in one embodiment of the present invention, a portion of the second conducting line overlaps the first conducting line.

According to the foregoing repair structure in one embodiment of the present invention, the material constituting the repair connecting layer includes indium tin oxide (ITO), indium zinc oxide (IZO), metal, alloy, a combination thereof, or other suitable material.

The present invention also provides an active device array substrate. The active device array substrate includes a substrate, a pixel array and a repair structure. The substrate has a display region and a peripheral circuit region. The pixel array is disposed in the display region of the substrate. The repair structure is disposed in the peripheral circuit region of the substrate. The repair structure is electrically connected to the pixel array and includes at least one first conducting line, a first insulating layer, at least one second conducting line, a second insulating layer and a repair connecting layer. The first insulating layer covers the first conducting line. The second conducting line is disposed over the first insulating layer and electrically connected to the pixel array. The second insulating layer covers the second conducting line and the first insulating layer. The repair connecting layer is disposed on the second insulating layer. The repair connecting layer is electrically connected to the first conducting line but is electrically insulated from the second conducting line.

According to the foregoing active device array substrate in one embodiment of the present invention, the second insulating layer has a thickness between 1500 Å and 5000 Å.

According to one embodiment of the present invention, the active device array substrate further includes at least one contact opening. The contact opening passes through the first insulating layer and the second insulating layer, and a portion of the repair connecting layer is electrically connected with the first conducting line through the contact opening.

According to the foregoing active device array substrate in one embodiment of the present invention, the pixel array includes a plurality of scan lines, a plurality of data lines, a plurality of active device and a plurality of pixel electrodes. The repair structure further includes a plurality of second conducting lines. Furthermore, each of the data lines is electrically connected to one of the second conducting lines of the repair structure, and each active device is electrically connected to one of the scan lines and one of the data lines and each pixel electrode is electrically connected to one of the active devices correspondingly.

According to the foregoing active device array substrate in one embodiment of the present invention, the repair structure further includes a semiconductor layer disposed between the first insulating layer and the second conducting line.

According to the foregoing active device array substrate in one embodiment of the present invention, a portion of the second conducting line covers the first conducting line.

According to the foregoing active device array substrate in one embodiment of the present invention, the material constituting the repair connecting layer includes indium tin oxide, indium zinc oxide, metal, alloy, a combination thereof or other suitable material.

In the repair structure of the present invention, only a single second insulating layer is disposed between the repair connecting layer and the second conducting line. When a laser repair process is performed, the laser can easily burn through the second insulating layer so that the repair connecting layer and the second conducting line are fused together. Therefore, repair failure after the laser repair process rarely occurs so that the second conducting line and the first conducting line can be electrically connected. In other words, the repair structure is able to increase the repair yield. In addition, the active device array substrate in the present invention has the aforementioned repair structure, and therefore, the active device array substrate can have a higher repair yield.

It is understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present embodiments of the invention, examples of which are illustrated in the accompanying drawings. Wherever possible, the same reference numbers are used in the drawings and the description to refer to the same or like parts.

Figure 2A:
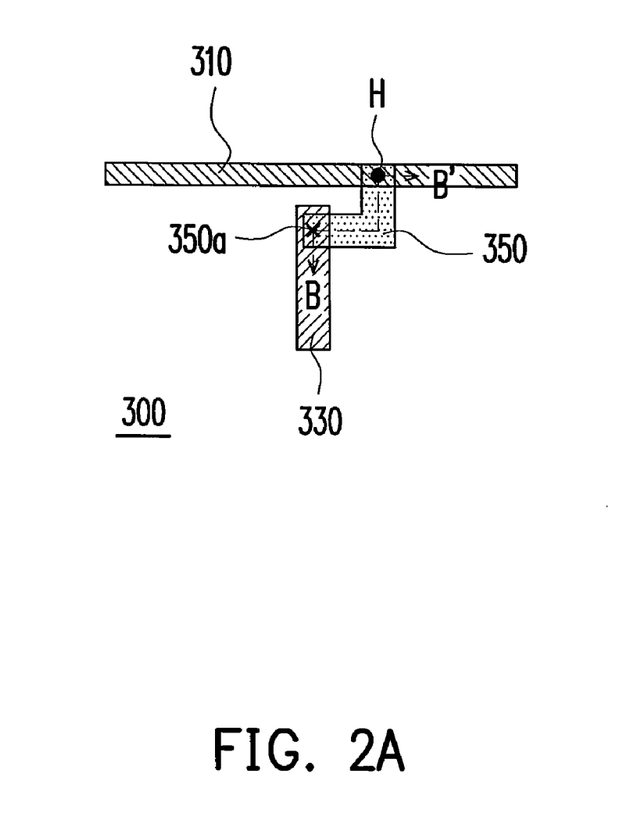
FIG. 2A is a top view of a repair structure according to one embodiment of the present invention.
Figure 2B:
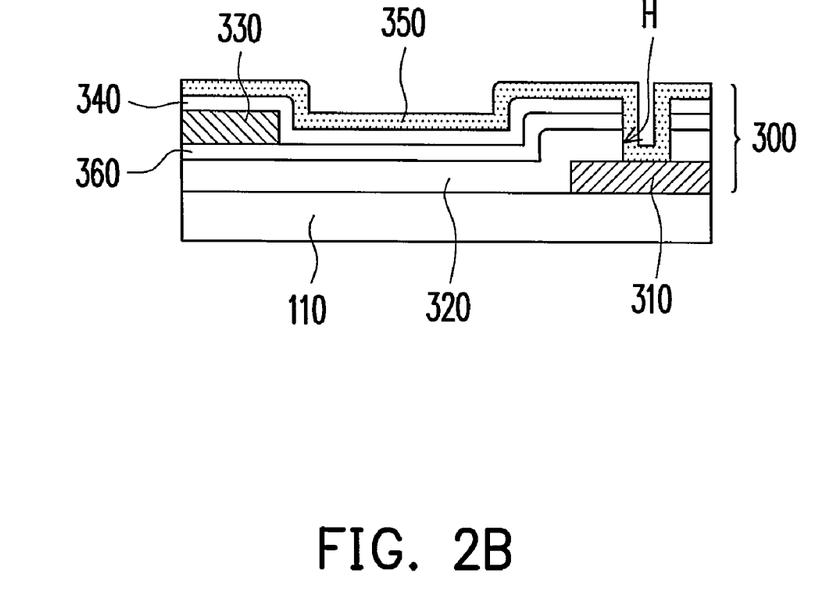
FIG. 2B is a schematic cross-sectional view along line B-B' of the repair structure shown in FIG. 2A.

FIG. 2A is a top view of a repair structure according to one embodiment of the present invention. FIG. 2B is a schematic cross-sectional view along line B-B' of the repair structure shown in FIG. 2A. As shown in FIGS. 2A and 2B, the repair structure 300 is fabricated over a substrate 110. The repair structure 300 includes a substrate 110, at least one first conducting line 310, a first insulating layer 320, at least one second conducting line 330, a second insulating layer 340 and a repair connecting layer 350. The at least one first conducting line 310 is disposed on the substrate 110. The first insulating layer 320 is disposed over the substrate 110 to cover the first conducting line 310. The second conducting line 330 is disposed over the first insulating layer 320. The second insulating layer 340 covers the second conducting line 330 and the first insulating layer 320. The repair connecting layer 350 is disposed on the second insulating layer 340. In one embodiment, a portion of the repair connecting layer 350 covers the first conducting line 310 and the second conducting line 330. The repair connecting layer 350 is electrically connected to the first conducting line 310. Furthermore, the repair connecting layer 350 overlaps the second conducting line 330 but is electrically insulated from the second conducting line 330 (that is, the repair connecting line 350 and the second conducting line 330 are electrically insulated).

In the present embodiment, the repair structure further comprises at least one contact opening H and a semiconductor layer 360. The contact opening H passes through the first insulating layer 320 and the second insulating layer 340. A portion of the repair connecting layer 350 is electrically connected with the first conducting line 310 through the contact opening H. The semiconductor layer 360 is disposed between the first insulating layer 320 and the second conducting line 330.

The material constituting the first conducting line 310 includes, for example, aluminum, aluminum alloy or other suitable conductive material. The material constituting the first insulating layer 320 includes, for example, silicon nitride or other suitable material. The material constituting the second conducting line 330 includes, for example, aluminum, aluminum alloy, chromium, titanium or other suitable conductive material. The material constituting the second insulating layer 340 includes, for example, silicon nitride or other suitable material. The second insulating layer 340 has a thickness between 1500 Å and 5000 Å, for example. The repair connecting layer 350 is fabricated using a conductive material or other suitable material, for example. The material constituting the repair connecting layer 350 includes, for example, indium tin oxide (ITO), indium zinc oxide (IZO), metal, alloy, a combination thereof, or other suitable conductive material. The semiconductor layer 360 includes, for example, an amorphous silicon layer and a doped amorphous silicon layer.

The repair structure 300 in the present embodiment can be used for repairing a number of types of defects, for example, a broken line defect in a liquid crystal display panel. The method of repair includes performing a laser fusion process at a fuse contact 350a so that the repair connecting layer 350 and the second conducting line 330 are fused together and the functions of most of the lines electrically connected to the second conducting line 330 are reconstituted. It should be noted that, compared with the conventional technique of having an insulating layer 162, an amorphous silicon layer 164 and a doped amorphous silicon layer 166 between the data line 130 and the repair line 150, only a single second insulating layer 340 is disposed between the repair connecting layer 350 and the second conducting line 330 in the embodiment of the present invention. When a laser repair process is performed, the laser can easily burn through the second insulating layer 340 to fuse the repair connecting layer 350 and the second conducting line 330 together. Hence, failure to repair after the laser repair process rarely occurs. After the repair, the second conducting line 330 electrically connects with the first conducting line 310 through the repair connecting layer 350. Hence, the functions of most of the lines electrically connected to the second conducting line 330 are reconstituted. Accordingly, the repair structure 300 in the present invention can genuinely increase the repair yield.

Figure 2C:
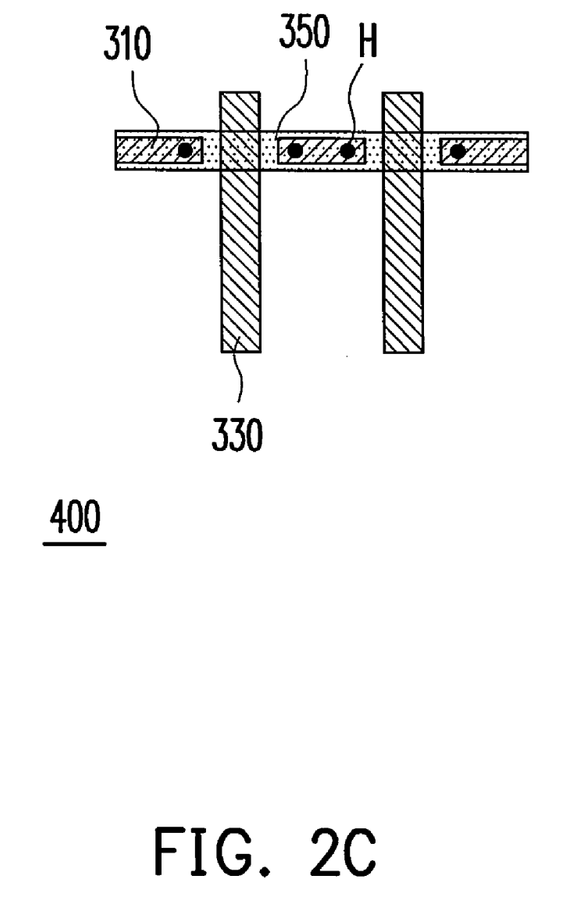
FIGS. 2C through 2E are structural diagrams showing the repair structures in different embodiments.
Figure 2D:
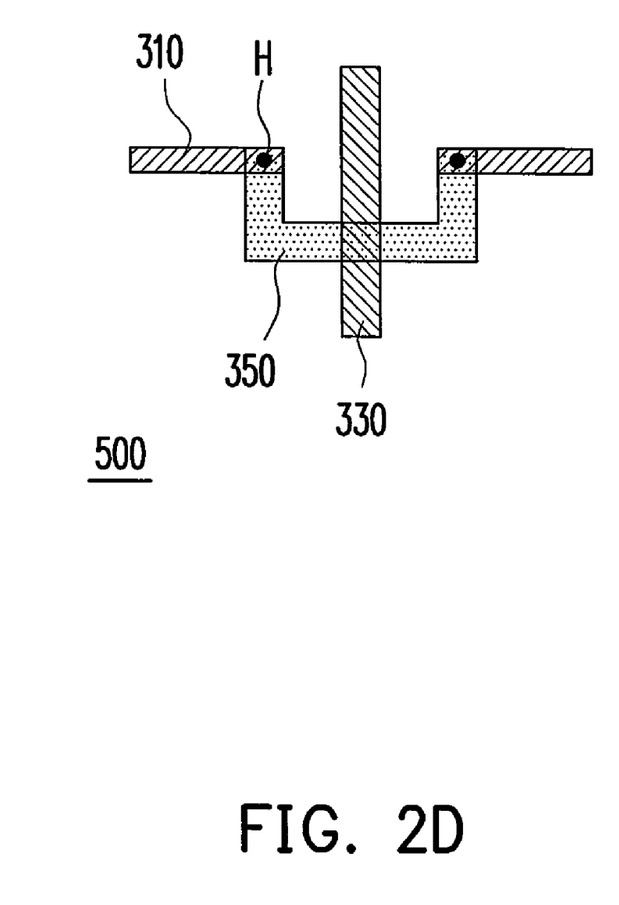
Figure 2E:
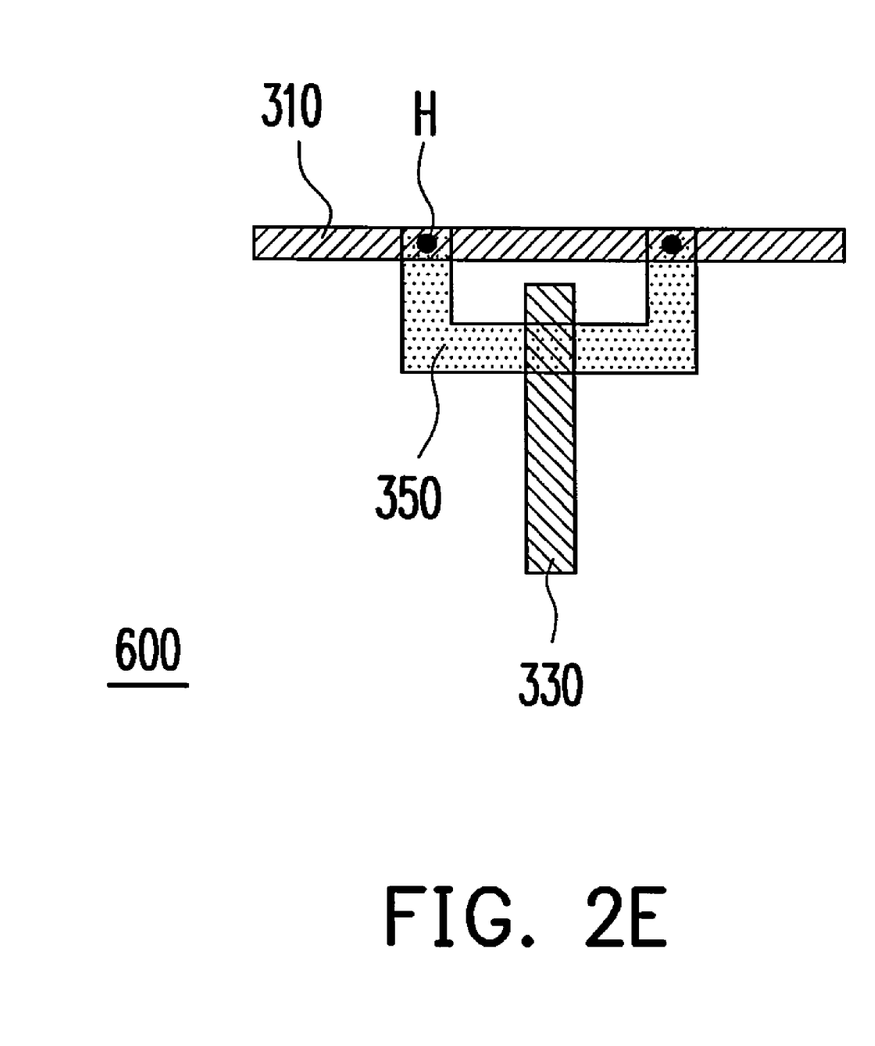

It should be noted that, in the repair structure 300 of the present embodiment, the first conducting line 310, the second conducting line 330 and the repair connecting layer 350 are disposed in the form shown in FIG. 2A. However, the form shown in FIG. 2A is just one example. FIGS. 2C through 2E are structural diagrams showing the repair structures of different embodiments. In the repair structures 400, 500, 600 shown in FIGS. 2C through 2E, the first conducting line 310, the second conducting line 330 and the repair connecting layer 350 have different arrangements. It should be noted that, in the foregoing repair structures 300, 400, 500 and 600, the second conducting line 330 does not overlap the first conducting line 310. However, in other embodiments, a portion of the second conducting line 330 may overlap the first conducting line 310.

To illustrate the feasibility of using the repair structure in the present invention to repair a broken line defect in a liquid crystal display panel or an active device array substrate, the repair of an active device array substrate is described in detail.

Figure 3A:
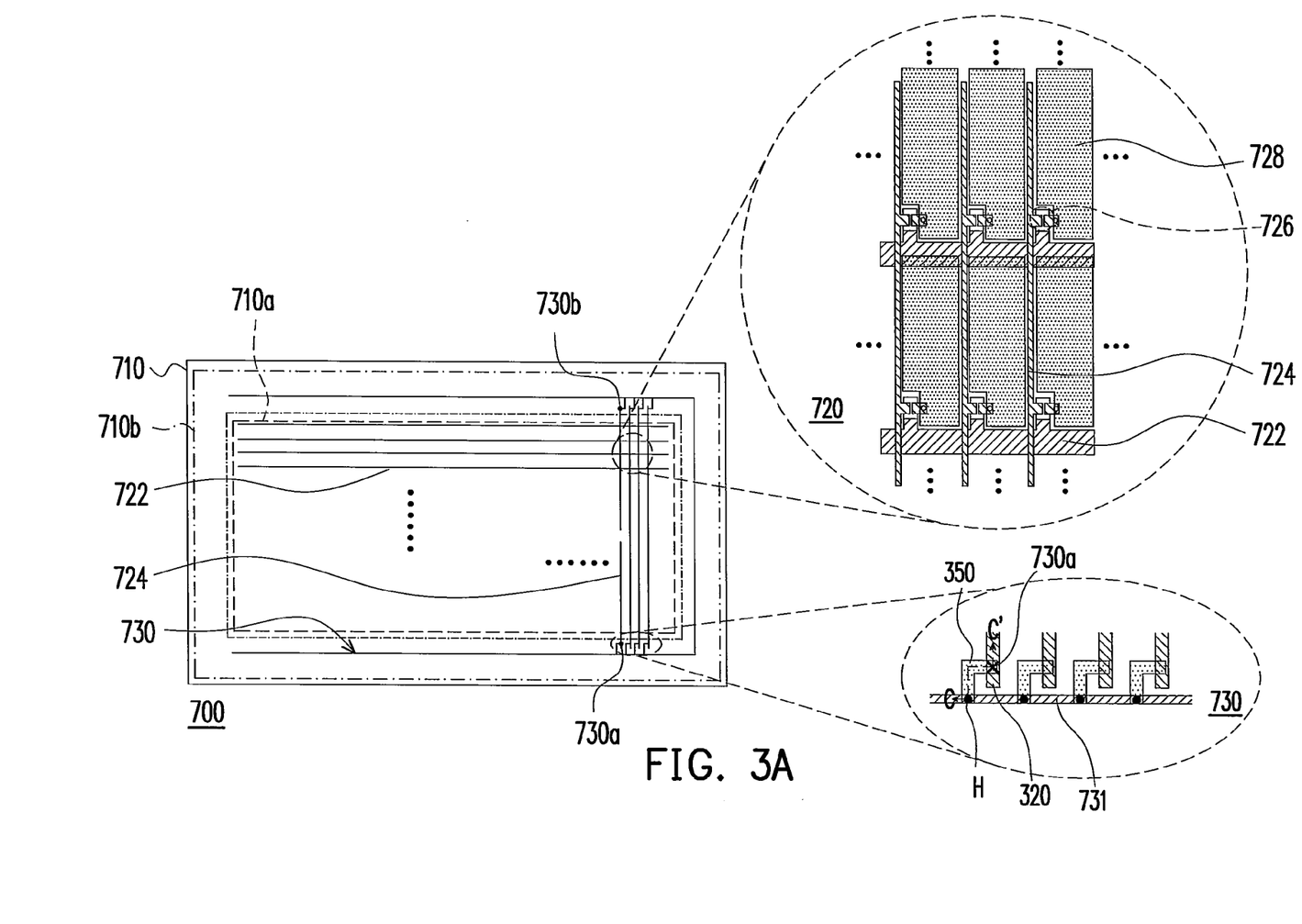
FIG. 3A is a top view of an active device array substrate according to one embodiment of the present invention.
Figure 3B:
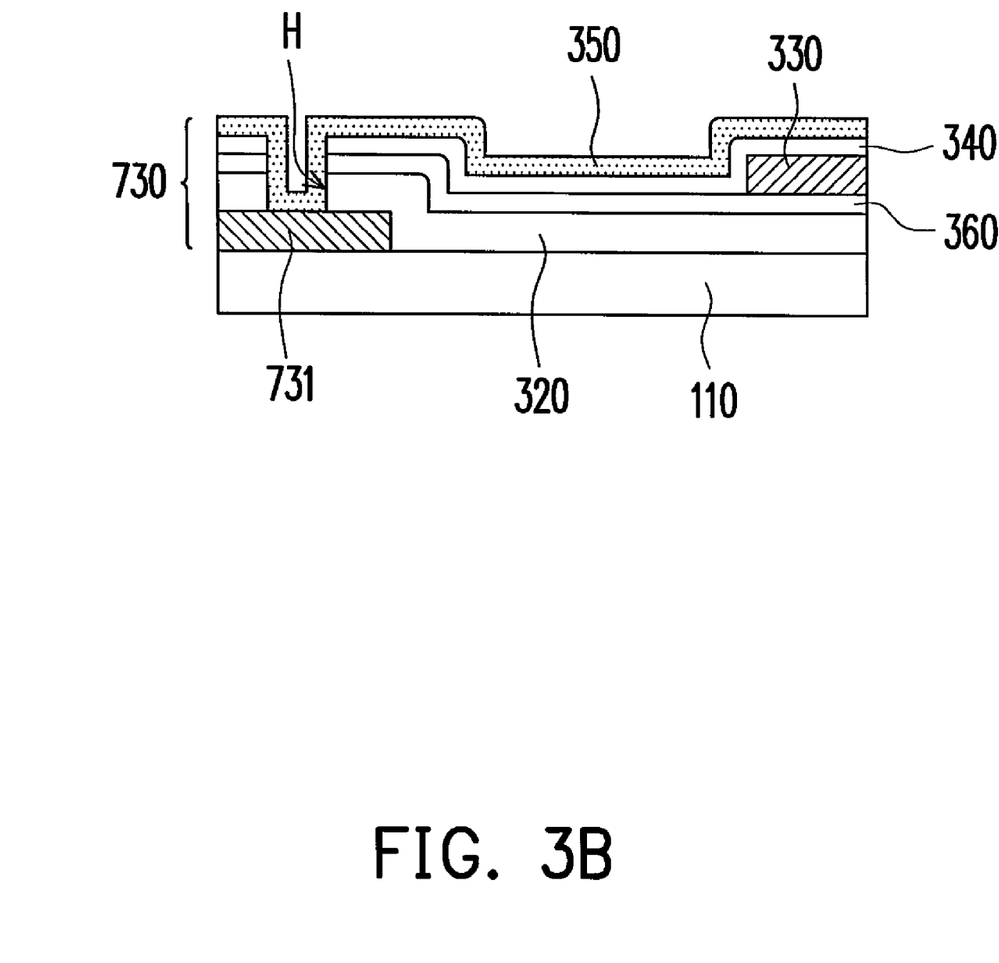
FIG. 3B is a schematic cross-sectional view along line C-C' of the active device array substrate shown in FIG. 3A.

FIG. 3A is a top view of an active device array substrate according to one embodiment of the present invention. FIG. 3B is a schematic cross-sectional view along line C-C' of the active device array substrate shown in FIG. 3A. As shown in FIGS. 3A and 3B, the active device array substrate 700 includes a substrate 710, a pixel array 720 and a repair structure 730. The substrate 710 has a display region 710a and a peripheral circuit region 710b. The pixel array 720 is disposed in the display region 710a of the substrate 710. The repair structure 730 is disposed in the peripheral circuit region 710b of the substrate 710. The repair structure 730 electrically connects with the pixel array 720 and includes at least one first conducting line 731, a first insulating layer 320, at least one second conducting line 330, a second insulating layer 340 and a repair connecting layer 350. The first conducting line 731, the first insulating layer 320, the second conducting line 330, the second insulating layer 340 and the repair connecting layer 350 has the same disposing relationships as that of the various elements in the aforementioned repair structure 300. In particular, the second conducting line 330 electrically connects with the pixel array 720.

In a similar way to the repair structure 300, the repair structure 730 in the active device array substrate 700 also includes at least one contact opening H and a semiconductor layer 360. The contact opening H passes through the first insulating layer 320 and the second insulating layer 340, and a portion of the repair connecting layer 350 is electrically connected with the first conducting line 731 through the contact opening H. The semiconductor layer 360 is disposed between the first insulating layer 320 and the second conducting line 330. In addition, the pixel array 720 includes a plurality of scan lines 722, a plurality of data lines 724, a plurality of active devices 726 and a plurality of pixel electrodes 728. The repair structure 710 further includes a plurality of second conducting lines 330. Each of the data lines 724 electrically connects with one of the second conducting lines 330 of the repair structure 710, and each active device 726 electrically connects with one of the scan lines 722 and one of the data lines 724 correspondingly. Furthermore, each pixel electrode 728 electrically connects with one of the active devices 726 correspondingly.

More specifically, the substrate 710 is, for example, a glass substrate, a quartz substrate or a substrate fabricated using other material. The material constituting the scan lines 722 includes, for example, aluminum, aluminum alloy, or other suitable conductive material. The material constituting the data lines 724 includes, for example, aluminum, aluminum alloy, chromium, titanium, or other suitable conductive material. The active devices 726 are, for example, thin film transistors, three-terminal switching devices or other suitable devices. The pixel electrodes 728 are, for example, transparent electrodes, reflective electrodes, or transflective electrodes. The material constituting the pixel electrode 728 includes, for example, indium tin oxide, indium zinc oxide, or other transparent or non-transparent conductive material. The first conducting lines 731 and the scan lines 722 are preferably fabricated using an identical material, and the first conducting lines 731 and the scan lines 722 can be formed at the same time, for example. The material constituting the first insulating layer 320 is, for example, identical to the one in the previous embodiment. The second conducting lines 330 and the data lines 724 are preferably fabricated using an identical material, and the second conducting lines 330 and the data lines 724 can be formed at the same time, for example. The material constituting the second insulating layer 340 and the thickness of the second insulating layer 340 are identical to the ones in the previous embodiment. The material constituting the repair connecting layer 350 is, for example, identical to the pixel electrodes 728, and the repair connecting layer 350 and the pixel electrodes 728 can be formed at the same time, for example. The semiconductor layer 360 includes, for example, an amorphous silicon layer and a doped amorphous silicon layer.

In the process of fabricating the foregoing active device array substrate 700 or in the process of using the active device array substrate 700 to assemble a liquid crystal display panel, defects cannot be entirely avoided. When a broken data line 724 on the active device array substrate 700 is detected, a repair process can be performed through the repair structure 730. More specifically, if a data line 724 on the active device array substrate 700 has a broken line defect, a laser fusion process is performed respectively on the fuse contacts 730a and 730b to connect the repair connecting layer 350 and the second conducting line 320 that electrically connects with the corresponding broken data line 724. Hence, most of the functions of the broken data line 724 are reconstituted through the second conducting line 320, the repair connecting layer 350 and the first conducting layer 731.

The condition of performing a laser fusion process to electrically connect the repair connecting layer 350 with the second conducting line 330 is similar to that performed on the aforementioned repair structure 300. The laser can easily burn through the second insulating layer 340 so that the repair connecting layer 350 and the second conducting line 330 are fused together. Therefore, a failure to repair rarely occurs. After the laser repair process, most of the functions of the data line 724 are reconstituted through the second conducting line 320, the repair connecting layer 350 and the first conducting line 731. In other words, the active device array substrate 700 can have a is better repair yield.

In summary, the repair structure and the active device array substrate have at least the following advantages:

1. The repair structure in the present invention only has a single second insulating layer between the repair connecting layer and the second conducting line. When a laser repair process is performed, the laser can easily burn through the second insulating layer to fuse the repair connecting layer and the second conducting line together. Therefore, a failure to repair after the laser repair process is rare. In other words, the repair structure is able to increase the repair yield.

2. By fabricating the repair structure according to the present invention on an active device array substrate, the active device array substrate has a higher repair yield.

3. The method of fabricating the repair structure and the active device array substrate in the present invention is compatible to the existing process. Thus, only few photomasks needs to be changed and there is no need to acquire additional equipment.

4. The repair structure of the present invention can be applied to display panel and/or display module.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An active device array substrate, comprising:
   a substrate having a display region and a peripheral circuit region surrounding the display region;
   a pixel array disposed in the display region of the substrate; and
   a repair structure, disposed in the peripheral circuit region of the substrate, the repair structure comprising
      at least one repair line,
      a first insulating layer covering the repair line,
      at least one second conducting line disposed over the first insulating layer and electrically connected with the pixel array,
      a second insulating layer covering the second conducting line and the first insulating layer, and
      at least one repair connecting layer having a continuous pattern, the repair connecting layer being disposed on the second insulating layer, electrically connecting with the repair line and overlapping the second conducting line, wherein the repair connecting layer is electrically insulated from the second conducting line
   wherein the repair line surrounds the display region, the at least one second conducting line includes a plurality of second conducting lines extending from the display region to the peripheral circuit region and being electrically connected with the pixel array, the at least one repair connecting layer includes a plurality of repair connecting layers disposed on the second insulating layer, each of the repair connecting layers is electrically connecting with the repair line and overlapped with one of the second conducting lines respectively, and the repair connecting layers are electrically insulated from the second conducting lines, and
   each of the second conducting lines has two ends located at the peripheral circuit region, the two ends of one of the second conducting lines are overlapped with different repair connecting layers respectively.

2. The active device array substrate of claim 1, wherein the second insulating layer has a thickness between about 1500 Å and 5000 Å.

3. The active device array substrate of claim 1, wherein the repair structure further comprises at least one contact opening passing through the first insulating layer and the second insulating layer such that part of the repair connecting layer is electrically connected with the repair line through the at least one contact opening.

4. The active device array substrate of claim 1, wherein the pixel array comprises a plurality of scan lines, a plurality of data lines, a plurality of active devices and a plurality of pixel electrodes, and wherein the at least one second conducting line comprises a plurality of second conducting lines, each data line electrically connecting with one of the second conducting lines of the repair structure, each active device electrically connecting with one of the scan lines and one of the data lines, each pixel electrode electrically connecting with one of the active devices, correspondingly.

5. The active device array substrate of claim 1, wherein the repair structure further comprises a semiconductor layer disposed between the first insulating layer and the second conducting line.

6. The active device array substrate of claim 1, wherein a portion of the second conducting line covers the repair line.

7. The active device array substrate of claim 1, wherein material constituting the repair connecting layer comprises indium tin oxide, indium zinc oxide, metal, alloy, or a combination thereof.

8. A repair structure, comprising:

a substrate;

at least one repair line disposed on the substrate;

a first insulating layer disposed over the substrate to cover the repair line;

at least one second conducting line disposed over the first insulating layer;

a second insulating layer covering the second conducting line and the first insulating layer; and a repair connecting layer having a continuous pattern, the repair connecting layer being disposed on the second insulating layer and electrically connecting with the repair line, the repair connecting layer being overlapped with the second conducting line, wherein the repair connecting layer only electrically contacts with the repair line and is electrically insulated from the second conducting line.

9. The repair structure of claim 8, wherein the second insulating layer has a thickness between about 1500 Å and 5000 Å.

10. The repair structure of claim 8, further comprising at least one contact opening passing through the first insulating layer and the second insulating layer such that part of the repair connecting layer is electrically connected with the repair line through the at least one contact opening.

11. The repair structure of claim 8, further comprising a semiconductor layer disposed between the first insulating layer and the second conducting line.

12. The repair structure of claim 8, wherein a portion of the second conducting line covers the repair line.

13. The repair structure of claim 8, wherein the material constituting the repair connecting layer comprises indium tin oxide (ITO), indium zinc oxide (IZO), metal, alloy, or a combination thereof.

* * * * *